(12) United States Patent
Hata

(10) Patent No.: US 6,998,649 B2
(45) Date of Patent: Feb. 14, 2006

(54) SEMICONDUCTOR LIGHT-EMITTING DEVICE

(75) Inventor: Masayuki Hata, Kadoma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/951,816

(22) Filed: Sep. 29, 2004

(65) Prior Publication Data

US 2005/0067625 A1    Mar. 31, 2005

(30) Foreign Application Priority Data

Sep. 29, 2003  (JP) ............................ 2003-337701

(51) Int. Cl.
*H01L 29/22*    (2006.01)
(52) U.S. Cl. .................... 257/99; 257/745; 257/762; 257/768
(58) Field of Classification Search ................. 257/99, 257/744, 745, 762, 768, 769
See application file for complete search history.

(56) References Cited

U.S. PATENT DOCUMENTS

| | | | |
|---|---|---|---|
| 4,706,251 A * | 11/1987 | Rona ............................. | 372/4 |
| 6,301,282 B1 * | 10/2001 | Capasso et al. .......... | 372/46.01 |
| 6,501,783 B1 * | 12/2002 | Capasso et al. ............... | 372/96 |
| 6,534,798 B1 * | 3/2003 | Scherer et al. ................ | 257/98 |
| 6,946,674 B1 * | 9/2005 | Nagao ......................... | 257/13 |

FOREIGN PATENT DOCUMENTS

| | | |
|---|---|---|
| EP | 0 442 002 B1 | 8/1991 |
| JP | 2001-291929 A | 10/2001 |

OTHER PUBLICATIONS

Kock, A., et al. "Strongly directional emission from AlGaAs/GaAs light-emitting diodes," Appl. Phys. Lett. 57 (22), Nov. 26, 1990, American Institute of Physics. pp. 2327-2329.

Vuckovi, Jelena., et al. "Surface Plasmon Enhanced Light-Emitting Diode." IEEE Journal of Quantum Electronics, vol. 36, No. 10, Oct. 2000, pp. 1131-1144.

Gontijo, I., et al. "Coupling of InGaN quantum-well photoluminescence to silver surface plasmons," Physical Review B, vol. 60, No. 16, Oct. 15, 1999, pp. 11 564-11 567.

* cited by examiner

*Primary Examiner*—Sara W. Crane
(74) *Attorney, Agent, or Firm*—McDermott Will & Emery LLP

(57) ABSTRACT

A semiconductor light-emitting device capable of attaining a surface plasmon effect while attaining excellent ohmic contact is provided. This semiconductor light-emitting device comprises a semiconductor layer formed on an emission layer, a first electrode layer formed on the semiconductor layer and a second electrode layer, formed on the first electrode layer, having a periodic structure. The first electrode layer is superior to the second electrode layer in ohmic contact with respect to the semiconductor layer, and the second electrode layer contains a metal exhibiting a higher plasma frequency than the first electrode layer.

20 Claims, 7 Drawing Sheets

SEMICONDUCTOR LIGHT-EMITTING DEVICE

BACKGROUND OF THE INVENTION

1. Field of the Invention

The present invention relates to a semiconductor light-emitting device, and more particularly, it relates to a semiconductor light-emitting device including an electrode layer exhibiting a high plasma frequency.

2. Description of the Background Art

In general, it is known as possible to excite surface plasmon (electronic oscillation) in a semiconductor light-emitting device by forming a metal layer exhibiting a high plasma frequency in a periodic structure, as disclosed in "Coupling of InGaN quantum-well photoluminescence to silver surface plasmons", Phys. Rev. B60, 11564–11567, 15 October 1999, for example. It is possible to improve emission efficiency and light extraction efficiency by effectively utilizing the surface plasmon (electronic oscillation).

Assuming that real parts of the dielectric constants $\epsilon_A$ and $\epsilon_B$ of a metal A and a dielectric B (including air or vacuum) have inverse signs, a light wave (electromagnetic wave) having intensity exponentially attenuating in two perpendicular directions is present on the interface between the metal A and the dielectric B in the following case:

$$\epsilon_A + \epsilon_B < 0$$

This electromagnetic wave is referred to as surface plasmon. The dielectric constant $\epsilon_A$ of the metal A is generally expressed as follows:

$$\epsilon_A = \epsilon_0(1 - \omega_P^2/\omega^2)$$

where $\epsilon_0$ represents the dielectric constant of vacuum, $\omega$ represents the frequency of light, and $\omega_P$ represents a value referred to as a plasma frequency. If the dielectric B is vacuum, surface plasmon is present with an angular frequency smaller than the following value:

$$\omega_S = \omega_P/2^{0.5}$$

The value $\omega_S$ is generally in the visual or ultraviolet wave range.

In order to attain the surface plasmon effect with respect to short-wavelength light in a semiconductor light-emitting device, a metal such as silver or aluminum exhibiting a high plasma frequency must be employed.

When an electrode of silver or aluminum for attaining the surface plasmon effect is formed on the surface of a p-type semiconductor layer in a short-wavelength semiconductor light-emitting device such as an AlGaInN-based light-emitting device, however, it is disadvantageously difficult to attain excellent ohmic contact.

SUMMARY OF THE INVENTION

The present invention has been proposed in order to solve the aforementioned problem, and an object of the present invention is to provide a semiconductor light-emitting device capable of attaining a surface plasmon effect while attaining excellent ohmic contact.

A semiconductor light-emitting device according to an aspect of the present invention comprises a semiconductor layer formed on an emission layer, a first electrode layer formed on the semiconductor layer and a second electrode layer, formed on the first electrode layer, having a periodic structure. The first electrode layer is superior to the second electrode layer in ohmic contact with respect to the semiconductor layer, and the second electrode layer contains a metal exhibiting a higher plasma frequency than the first electrode layer.

In the semiconductor light-emitting device according to this aspect, as hereinabove described, the first electrode layer superior to the second electrode layer in ohmic contact with respect to the semiconductor layer is provided on the semiconductor layer formed on the emission layer while the second electrode layer of the periodic structure containing the metal exhibiting a higher plasma frequency than the first electrode layer is provided on the first electrode layer, whereby the semiconductor light-emitting device can attain a surface plasmon effect through the second electrode layer while attaining excellent ohmic contact through the first electrode layer.

In the semiconductor light-emitting device according to the aforementioned aspect, the semiconductor layer is preferably a p-type nitride-based semiconductor layer, and the first electrode layer is preferably formed to be in contact with the p-type nitride-based semiconductor layer. When an electrode is formed on a p-type nitride-based semiconductor layer, it is particularly difficult to attain ohmic contact. Thus, the semiconductor light-emitting device employing the first electrode layer having an excellent ohmic property with respect to the p-type nitride-based semiconductor layer can attain excellent ohmic contact between the p-type nitride-based semiconductor layer and the first electrode layer.

In the semiconductor light-emitting device according to the aforementioned aspect, the periodic structure of the second electrode layer is preferably a periodic corrugated shape. According to this structure, the semiconductor light-emitting device can easily attain the surface plasmon effect through the second electrode layer. The periodic corrugated shape may be a structure having a periodically changing thickness.

In this case, the periodic structure of the second electrode layer may include a structure obtained by periodically arranging recess portions or projection portions of the corrugated shape in the form of a triangular lattice. According to this structure, the semiconductor light-emitting device can attain the surface plasmon effect through the second electrode layer having the structure obtained by periodically arranging the recess portions or the projection portions of the corrugated shape in the form of a triangular lattice.

In the aforementioned structure that the second electrode layer has the periodic corrugated shape, the periodic structure of the second electrode layer may include a striped periodic structure. According to this structure, the semiconductor light-emitting device can attain the surface plasmon effect through the second electrode layer having the striped periodic structure.

In this case, the semiconductor layer preferably has a projecting ridge portion, and the second electrode layer having the striped periodic structure is preferably formed on the ridge portion of the semiconductor layer along the extensional direction of the ridge portion. According to this structure, the semiconductor light-emitting device including the projecting ridge portion can easily attain the surface plasmon effect through the second electrode layer having the striped periodic structure formed on the ridge portion.

In the semiconductor light-emitting device according to the aforementioned aspect, the semiconductor layer preferably includes a surface formed with a periodic corrugated shape. According to this structure, the first and second electrode layers formed on the semiconductor layer also have periodic corrugated shapes, whereby the second electrode layer can be easily formed with the periodic corrugated shape for attaining the surface plasmon effect.

In this case, recess portions or projection portions of the surface of the semiconductor layer formed with the periodic corrugated shape are preferably periodically arranged in the form of a triangular lattice. According to this structure, the first and second electrode layers formed on the semiconductor layer also have corrugated shapes including recess portions or projection portions periodically arranged in the form of a triangular lattice, whereby the second electrode layer can be more easily formed with the periodic corrugated shape for attaining the surface plasmon effect.

In the semiconductor light-emitting device according to the aforementioned aspect, the first electrode layer preferably has a smaller thickness than the second electrode layer. According to this structure, the first electrode layer excellent in ohmic contact with respect to the semiconductor layer has transparency for transmitting light emitted from the emission layer to the second electrode layer having the periodic structure with a high plasma frequency without much attenuating the light, whereby the semiconductor light-emitting device can transmit light of intensity capable of sufficiently exciting surface plasmon toward the surface of the second electrode layer.

In the semiconductor light-emitting device according to the aforementioned aspect, the first electrode layer is preferably made of at least one of Ni, Pd and Pt, and the second electrode layer is preferably made of at least either Al or Ag. When the first and second electrode layers are made of such materials, the semiconductor light-emitting device can easily attain the surface plasmon effect through the second electrode layer while attaining excellent ohmic contact through the first electrode layer.

In this case, the first electrode layer may contain Pd, and the second electrode layer may contain Ag. According to this structure, the semiconductor light-emitting device can further easily attain the surface plasmon effect through the second electrode layer while attaining excellent ohmic contact through the first electrode layer due to the possibility of Pd allowing excellent ohmic contact and the high plasma frequency of Ag.

In the aforementioned structure that the first electrode layer is made of at least one of Ni, Pd and Pt and the second electrode layer is made of at least either Al or Ag, the first electrode layer may contain Pt, and the second electrode layer may contain Al. According to this structure, the semiconductor light-emitting device can further easily attain the surface plasmon effect through the second electrode layer while attaining excellent ohmic contact through the first electrode layer due to the possibility of Pt allowing excellent ohmic contact and the high plasma frequency of Al.

In the aforementioned structure that the first electrode layer is made of at least one of Ni, Pd and Pt and the second electrode layer is made of at least either Al or Ag, the first electrode layer may contain Ni, and the second electrode layer may contain Ag. According to this structure, the semiconductor light-emitting device can further easily attain the surface plasmon effect through the second electrode layer while attaining excellent ohmic contact through the first electrode layer due to the possibility of Ni allowing excellent ohmic contact and the high plasma frequency of Ag.

In the semiconductor light-emitting device according to the aforementioned aspect, the first electrode layer preferably has the periodic structure, and the second electrode layer having the periodic structure is preferably formed on the first electrode layer to reflect the periodic structure of the first electrode layer. According to this structure, the second electrode layer having the periodic structure for attaining the surface plasmon effect can be easily formed on the first electrode layer when the first electrode layer has the periodic structure.

In this case, the first electrode layer and the second electrode layer may be formed with the same periodic corrugated shapes. According to this structure, the semiconductor light-emitting device can easily attain the surface plasmon effect through the second electrode layer formed with the same periodic corrugated shape as the first electrode layer.

In the aforementioned structure that the second electrode layer is formed to reflect the periodic structure of the first electrode layer, the second electrode layer may be formed with a periodic corrugated shape on the interface between the second electrode layer and the first electrode layer. According to this structure, the semiconductor light-emitting device can easily attain the surface plasmon effect through the second electrode layer having the periodic corrugated shape formed on the interface between the second electrode layer and the first electrode layer.

The semiconductor light-emitting device according to the aforementioned aspect preferably further comprises a protective layer formed on the second electrode layer. According to this structure, the semiconductor light-emitting device can suppress oxidation of the surface of the second electrode layer through the protective layer.

The semiconductor light-emitting device according to the aforementioned aspect preferably extracts light emitted from the emission layer through a region formed with the second electrode layer having the periodic structure. According to this structure, the semiconductor light-emitting device extracting the light emitted from the emission layer through the region formed with the second electrode layer having the periodic structure can attain the surface plasmon effect through the second electrode layer while attaining excellent ohmic contact through the first electrode layer.

The semiconductor light-emitting device according to the aforementioned aspect preferably extracts light emitted from the emission layer through a region opposite to a region formed with the second electrode layer having the periodic structure. According to this structure, the semiconductor light-emitting device extracting the light emitted from the emission layer through the region opposite to the region formed with the second electrode layer having the periodic structure can attain the surface plasmon effect through the second electrode layer while attaining excellent ohmic contact through the first electrode layer.

In the semiconductor light-emitting device according to the aforementioned aspect, the semiconductor layer preferably includes a ZnO layer. According to this structure, the semiconductor light-emitting device including the ZnO layer can attain the surface plasmon effect through the second electrode layer while attaining excellent ohmic contact through the first electrode layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

The structure of a nitride-based semiconductor LED according to a first embodiment of the present invention extracting light through a periodically formed electrode is described with reference to FIGS. 1 to 3.

Figure 1:
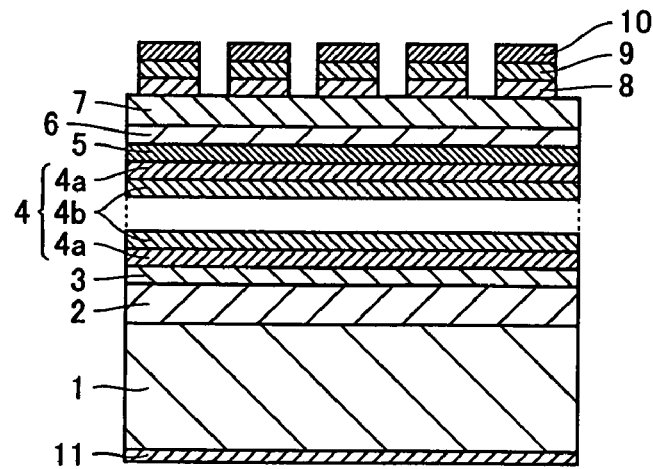
FIG. 1 is a sectional view showing the structure of a semiconductor light-emitting diode (LED) according to a first embodiment of the present invention.

In the nitride-based semiconductor LED according to the first embodiment, an n-type layer 2 of single-crystalline Si-doped GaN having a thickness of about 5 $\mu$m is formed on the (0001) Ga plane of an n-type GaN substrate 1 doped with oxygen or Si, as shown in FIG. 1. An n-type cladding layer 3 of single-crystalline Si-doped $Al_{0.1}Ga_{0.9}N$ having a thickness of about 0.15 $\mu$m is formed on the n-type layer 2.

A multiple quantum well (MQW) emission layer 4 having an MQW structure prepared by alternately forming six barrier layers 4a of single-crystalline undoped GaN each having a thickness of about 5 nm and five well layers 4b of single-crystalline undoped $Ga_{0.9}In_{0.1}N$ each having a thickness of about 5 nm is formed on the n-type cladding layer 3. The MQW emission layer 4 is an example of the "emission layer" in the present invention. A protective layer 5 of single-crystalline undoped GaN having a thickness of about 10 nm is formed on the MQW emission layer 4. This protective layer 5 has a function of preventing the MQW emission layer 4 from deterioration of crystal quality by preventing desorption of In atoms forming the MQW emission layer 4.

A p-type cladding layer 6 of single-crystalline Mg-doped $Al_{0.1}Ga_{0.9}N$ having a thickness of about 0.15 $\mu$m is formed on the protective layer 5. A p-type contact layer 7 of single-crystalline Mg-doped $Ga_{0.95}In_{0.05}N$ having a thickness of about 0.3 $\mu$m is formed on the p-type cladding layer 6. The p-type contact layer 7 is an example of the "semiconductor layer" in the present invention. An ohmic electrode 8 of Pd having a thickness of about 1 nm, an electrode 9 of Ag having a thickness of about 2 nm and a protective layer 10 of Au having a thickness of about 1 nm are formed on the p-type contact layer 7 in this order. The ohmic electrode 8 is an example of the "first electrode layer" in the present invention, and the electrode 9 is an example of the "second electrode layer" in the present invention. The ohmic electrode 8, provided for attaining excellent ohmic contact with the p-type contact layer 7 of Mg-doped $Ga_{0.95}In_{0.05}N$, is superior to the electrode 9 in ohmic property with respect to the p-type contact layer 7. The electrode 9, provided for attaining a surface plasmon effect, is made of the metal (Ag) exhibiting a higher plasma frequency than the ohmic electrode 8 of Pd. The protective layer 10 is provided for inhibiting the surface of the electrode 9 from oxidation.

According to the first embodiment, each of the ohmic electrode 8 consisting of Pd, the electrode 9 consisting of Ag and the protective layer 10 consisting of Au is formed to have a periodic structure. As shown in FIG. 2, the periodic structure of each of the ohmic electrode 8, the electrode 9 and the protective layer 10 is obtained by periodically arranging circular portions (circular holes) 152 formed with none of the ohmic electrode 8, the electrode 9 and the protective layer 10 in the form of a (two-dimensional) triangular lattice. In other words, each of the ohmic electrode 8, the electrode 9 and the protective layer 10 is formed on a hatched (slanted) region 151 excluding the circular portions (circular holes) 152 shown in FIG. 2. According to the first embodiment, the distance D between each pair of adjacent circular portions (circular holes) 152 is set to 500 nm, and the diameter R of each circular portion (circular hole) 152 is set to 300 nm. The nitride-based semiconductor LED is designed on the assumption that the wavelength of light emitted from the MQW emission layer 4 is 380 nm.

An n-side electrode 11 consisting of an ohmic electrode of Al or Ag, a barrier metal layer of Pt or Ti and a pad metal layer of Au or Au—Sn from the side closer to the n-type GaN substrate 1 is formed on the overall back surface of the n-type GaN substrate 1. The barrier metal layer has a function of suppressing reaction between the ohmic electrode and the pad metal layer. The pad metal layer is made of the easily fusible metal such as Au or Au—Sn.

Figure 2:
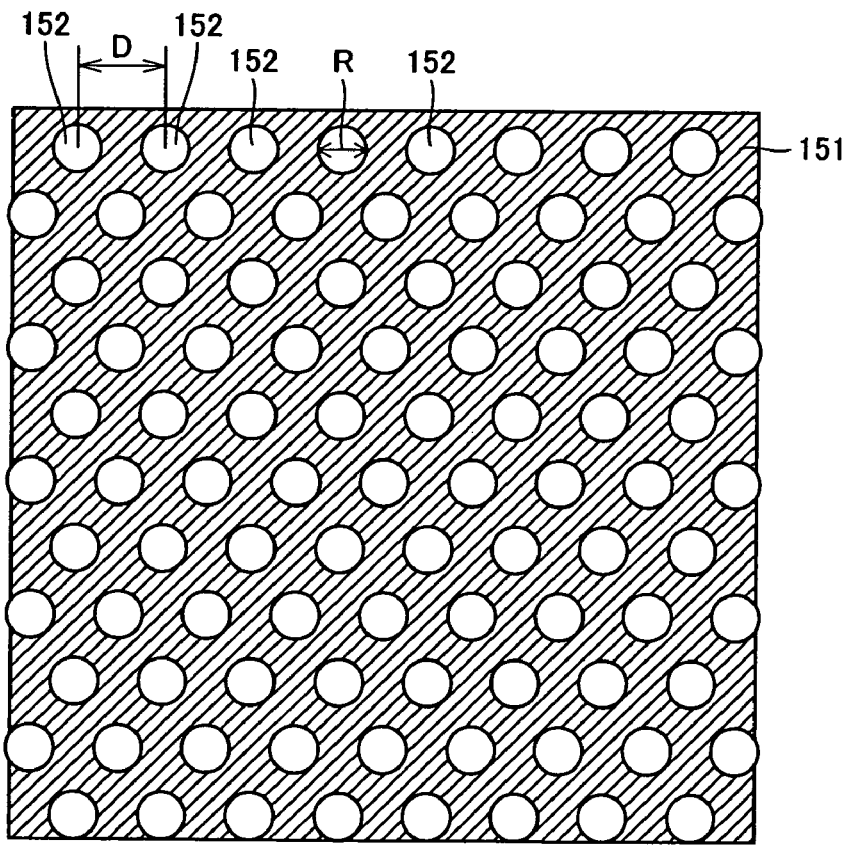
FIG. 2 is a plan view for illustrating a periodic structure of an electrode in the form of a triangular lattice in the semiconductor LED according to the first embodiment shown in FIG. 1.

According to the first embodiment, the electrode 9 of the metal (Ag) exhibiting a high plasma frequency is periodically provided in the form of a triangular lattice shown in FIG. 2 so that the dielectric constant periodically changes on the interface between the ohmic electrode 8 and the electrode 9 and the p-type contact layer 7. Thus, the nitride-based semiconductor LED can excite surface plasmon with the light emitted from the MQW emission layer 4. Each of the ohmic electrode 8 of Pd having a low plasma frequency and the protective layer 10 of Au also having a low plasma frequency is formed with the extremely small thickness of about 1 nm, to exert only small influence on the surface plasmon excited in the vicinity of the surface of the electrode 9 consisting of the metal (Ag) exhibiting a high plasma frequency and the interface between the protective layer 10 and a dielectric B (including air or vacuum) on the surface of the protective layer 10. Therefore, an electrode consisting of the ohmic electrode 8, the electrode 9 and the protective layer 10 exhibits a dielectric constant close to that of the electrode 9 consisting of Ag exhibiting a high plasma frequency.

Assuming that $\omega_L$ represents the angular frequency of the emission wavelength, $\epsilon_A$ represents the dielectric constant of the electrode 9 consisting of Ag and $\omega_B$ represents the dielectric constant of the dielectric B (including air or vacuum), the wave number $k_L$ of the excited surface plasmon is approximately expressed as follows:

$$k_L^2 = (\omega_L/c)^2 \epsilon_A \epsilon_B / (\epsilon_A + \epsilon_B)$$

Assuming that $n_C$ represents the refractive index of the p-type contact layer 7, $\Gamma$ represents the magnitude of reciprocal vectors of the periodic structure, p represents an integer and $\theta_C$ represents the angle of incidence of the light emitted from the MQW emission layer 4 and incident upon the interface between the p-type contact layer 7 and the ohmic electrode 8, the nitride-based semiconductor LED can excite the surface plasmon with light having an incident angle $\theta_C$ satisfying the following expression:

$$n_C(\omega_L/c)\sin\theta_C = k_L + p\Gamma$$

Figure 3:
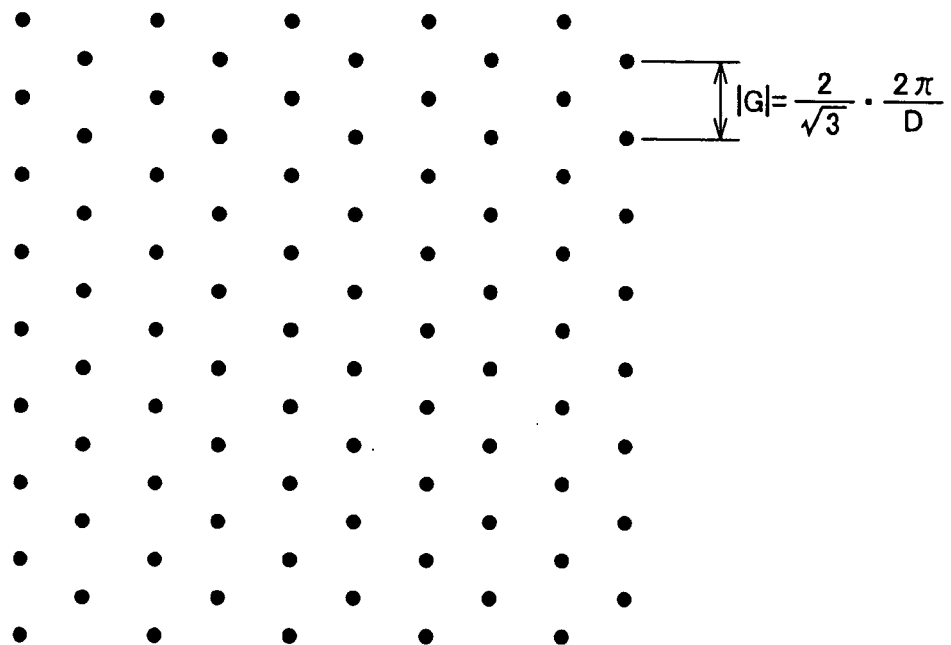
FIG. 3 is a plan view showing a reciprocal lattice of the triangular lattice shown in FIG. 2.

Assuming that $n_B$ represents the refractive index of the dielectric B (including air or vacuum) and q represents an integer, the nitride-based semiconductor LED emits the excited surface plasmon from its surface at an angle $\theta_B$ satisfying the following expression:

$$N_B(\omega_L/c)\sin\theta_B = k_L + q\Gamma$$

where the magnitude $\Gamma$ is supplied by the absolute value of an arbitrary reciprocal vector appearing in FIG. 3. The reciprocal lattice shown in FIG. 3 is obtained by rotating the triangular lattice shown in FIG. 2 by 90°. Referring to FIG. 3, G denotes the magnitude of the minimum reciprocal vector.

Assuming that $\theta_X$ represents a critical angle determined by the refractive indices of the p-type contact layer 7 and the dielectric B, light incident upon the interface does not outgo from any semiconductor in general if the incident angle $\theta_C$ is greater than the critical angle $\theta_X$. When the nitride-based semiconductor LED excites the surface plasmon, however, the light outgoes from the nitride-based semiconductor LED at the incident angle $\theta_B$. Therefore, it is possible to improve external efficiency of the nitride-based semiconductor LED.

According to the first embodiment, as hereinabove described, the ohmic electrode 8 of Pd having an excellent ohmic property with respect to the p-type contact layer 7 is formed on the p-type contact layer 7 while the electrode 9, having the periodic structure, of Ag exhibiting a higher plasma frequency than the ohmic electrode 8 is formed on the ohmic electrode 8, whereby the nitride-based semiconductor LED can attain the surface plasmon effect through the electrode 9 while attaining excellent ohmic contact through the ohmic electrode 8.

According to the first embodiment, further, the ohmic electrode 8 has the extremely small thickness of about 1 nm so that the light emitted from the MQW emission layer 4 is transmitted through the electrode 9, having the periodic structure, of Ag exhibiting a high plasma frequency without remarkable attenuation through the ohmic electrode 8, whereby the nitride-based semiconductor LED can transmit light allowing sufficient excitation of surface plasmon on the surface of the electrode 9.

A fabrication process for the nitride-based semiconductor LED according to the first embodiment is described with reference to FIGS. 1 and 2.

First, the n-type GaN substrate 1, having a thickness of about 200 µm to about 400 µm, provided with the (0001) Ga plane and doped with oxygen or Si is prepared. The n-type GaN substrate 1 is held at a single crystal growth temperature of about 1000° C. to about 1200° C. (about 1150° C., for example) for growing the n-type layer 2 of single-crystalline Si-doped GaN on the (0001) Ga plane of the n-type GaN substrate 1 with carrier gas of $H_2$ and $N_2$ ($H_2$ content: about 50%), source gas of $NH_3$ and trimethyl gallium (TMGa) and dopant gas of $SiH_4$ at a growth rate of about 3 µm/h, to have the thickness of about 5 µm. Thereafter the n-type GaN substrate 1 is held at the single crystal growth temperature of about 1000° C. to about 1200° C. (about 1150° C., for example) for growing the n-type cladding layer 3 of single-crystalline Si-doped $Al_{0.1}Ga_{0.9}N$ on the n-type layer 2 with carrier gas of $H_2$ and $N_2$ ($H_2$ content: about 1% to about 3%), source gas of $NH_3$, TMGa and trimethyl aluminum (TMAl) and dopant gas of $SiH_4$ at a growth rate of about 3 µm/h, to have the thickness of about 0.15 µm.

Then, the n-type GaN substrate 1 is held at a single crystal growth temperature of about 700° C. to about 1000° C. (about 850° C., for example) for alternately growing the six barrier layers 4a of single-crystalline undoped GaN each having the thickness of about 5 nm and the five well layers 4b of single-crystalline undoped $Ga_{0.9}In_{0.1}N$ each having the thickness of about 5 nm on the n-type cladding layer 3 with carrier gas of $H_2$ and $N_2$ ($H_2$ content: about 1% to about 5%) and source gas of $NH_3$, triethyl gallium (TEGa) and trimethyl indium (TMIn) at a growth rate of about 0.4 nm/s, thereby forming the MQW emission layer 4. Further, the protective layer 5 of single-crystalline undoped GaN is continuously grown at a growth rate of about 0.4 nm/s, to have the thickness of about 10 nm.

Thereafter the n-type GaN substrate 1 is held at a single crystal growth temperature of about 1000° C. to about 1200° C. (about 1150° C., for example) for forming the p-type cladding layer 6 of single-crystalline Mg-doped $Al_{0.1}Ga_{0.9}N$ on the protective layer 5 on the protective layer 5 with carrier gas of $H_2$ and $N_2$ ($H_2$ content: about 1% to about 3%), source gas of $NH_3$, TMGa and TMAl and dopant gas of $Cp_2Mg$ at a growth rate of about 3 µm/h, to have the thickness of about 0.15 µm.

Then, the n-type GaN substrate 1 is held at a single crystal growth temperature of about 700° C. to about 1000° C. (about 850° C., for example) for forming the p-type contact layer 7 of single-crystalline Mg-doped $Ga_{0.95}In_{0.05}N$ on the p-type cladding layer 6 with carrier gas of $H_2$ and $N_2$ ($H_2$ content: about 1% to about 3%), source gas of $NH_3$, TEGa and TMIn and dopant gas of $Cp_2Mg$ at a growth rate of about 3 µm/h, to have the thickness of about 0.3 µm.

P-type semiconductor layers (the p-type cladding layer 6 and the p-type contact layer 7) having high carrier concentrations can be obtained by activating Mg dopant with no heat treatment in an N$_2$ atmosphere, by reducing the hydrogen concentration of the carrier gas (reducing the H$_2$ content to about 1% to about 3%) during the crystal growth of the p-type cladding layer 6 and the p-type contact layer 7.

Then, a resist film (not shown) is formed on the overall surface of the p-type contact layer 7, and partially removed by exposure and development, for leaving only portions located on the circular portions 152 shown in FIG. 2. Then, the ohmic electrode 8 of Pd having the thickness of about 1 nm, the electrode 9 of Ag having the thickness of about 2 nm and the protective layer 10 of Au having the thickness of about 1 nm are formed on the overall surface by vacuum evaporation, and the left portions of the resist film are removed by the lift-off method, thereby bringing each of the ohmic electrode 8, the electrode 9 and the protective layer 10 shown in FIG. 1 into the periodic structure in the form of a triangular lattice shown in FIG. 2.

Thereafter the ohmic electrode of Al or Ag, the barrier metal layer of Pt or Ti and the pad metal layer of Au or Au—Sn are successively formed on the overall back surface of the n-type GaN substrate 1 by vacuum evaporation, thereby forming the n-side electrode 11. Thus, the nitride-based semiconductor LED according to the first embodiment is formed as shown in FIG. 1.

(Second Embodiment)

Figure 4:
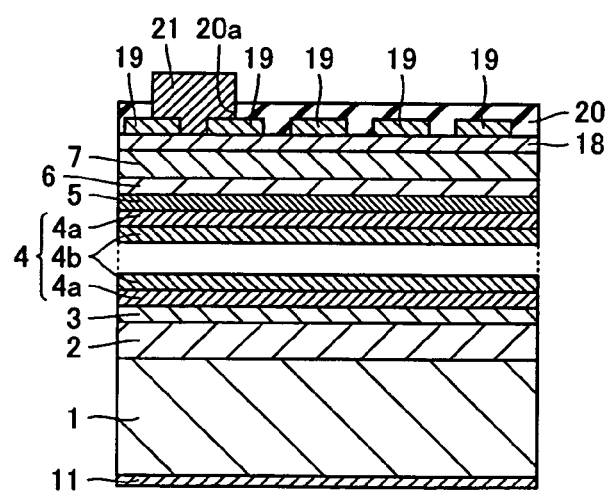
FIG. 4 is a sectional view showing the structure of a semiconductor LED according to a second embodiment of the present invention.

Referring to FIG. 4, a nitride-based semiconductor LED according to a second embodiment of the present invention is so formed that only an electrode 19 of a metal exhibiting a high plasma frequency has a periodic structure for extracting light through the electrode 19 having the periodic structure, dissimilarly to the aforementioned first embodiment.

According to the second embodiment, an ohmic electrode 18 of Pt having a thickness of about 1 nm is formed on the overall surface of a p-type contact layer 7, as shown in FIG. 4. The electrode 19, having a thickness of about 3 nm, of Al exhibiting a high plasma frequency is formed on the ohmic electrode 18 to have the periodic structure in the form of a triangular lattice similarly to that in the first embodiment shown in FIG. 2. The ohmic electrode 18 of Pt is superior to the electrode 19 of Al in ohmic property with respect to the p-type contact layer 7 of Mg-doped Ga$_{0.95}$In$_{0.05}$N. The electrode 19 consists of the metal (Al) exhibiting a higher plasma frequency than the ohmic electrode 18 of Pt. The ohmic electrode 18 is an example of the "first electrode layer" in the present invention, and the electrode 19 is an example of the "second electrode layer" in the present invention. A protective layer 20 of SiO$_2$ having a thickness of several 100 nm is formed to cover the electrode 19 and the ohmic electrode 18. A pad electrode 21 of Au having a thickness of about 1 μm is formed to be in contact with prescribed regions of the ohmic electrode 18 and the electrode 19 through an opening 20a of the protective layer 20.

According to the second embodiment, the distance D between each pair of adjacent circular portions (circular holes) 152 corresponding to those shown in FIG. 2 is set to 330 nm, and the diameter R of each circular portion (circular hole) 152 is set to 170 nm in the electrode 19 of Al exhibiting a high plasma frequency. In this case, the nitride-based semiconductor LED is designed on the assumption that the wavelength of light emitted from an emission layer is 380 nm.

The remaining structure of the second embodiment is similar to that of the aforementioned first embodiment.

In a fabrication process for the nitride-based semiconductor LED according to the second embodiment, steps up to that of forming the p-type contact layer 7 are similar to those in the aforementioned first embodiment. According to the second embodiment, the ohmic electrode 18 of Pt having the thickness of about 1 nm is thereafter formed on the overall surface of the p-type contact layer 7 by vacuum evaporation, and the electrode 19 of the metal (Al) exhibiting a high plasma frequency is thereafter formed by a lift-off method so that the circular portions (circular holes) 152, formed with no electrode 19, corresponding to those shown in FIG. 2 provide the periodic structure in the form of a triangular lattice. Then, the protective layer 20 of SiO$_2$ is formed on the overall surface, followed by formation of the opening 20a in a prescribed region. The pad electrode 21 of Au having the thickness of about 1 μm is formed to be electrically connected to the ohmic electrode 18 and the electrode 19 through the opening 20a. Thereafter an n-side electrode 11 is formed on the back surface of an n-type GaN substrate 1 through a process similar to that in the first embodiment.

According to the second embodiment, as hereinabove described, the ohmic electrode 18 of Pt having an excellent ohmic property is formed on the overall surface of the p-type contact layer 7 and the electrode 19, having the periodic structure in the form of a triangular lattice, of Al exhibiting a high plasma frequency is thereafter formed on the ohmic electrode 18, whereby the nitride-based semiconductor LED can attain a surface plasmon effect through the electrode 19 while attaining excellent ohmic contact through the ohmic electrode 18.

The remaining effects of the second embodiment are similar to those of the aforementioned first embodiment.

(Third Embodiment)

Figure 5:
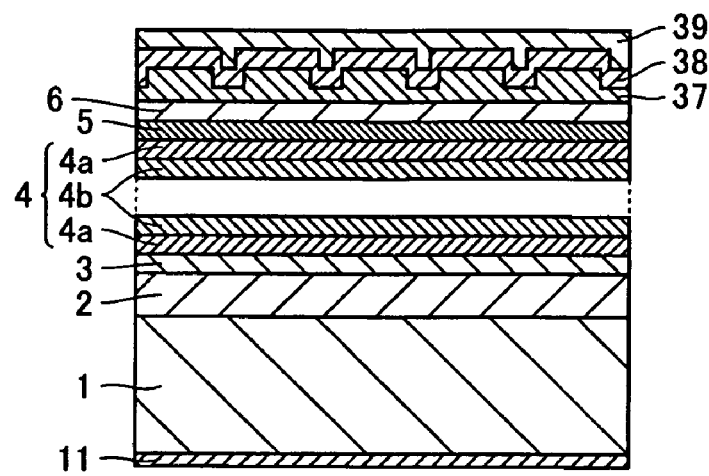
FIG. 5 is a sectional view showing the structure of a semiconductor LED according to a third embodiment of the present invention.

Referring to FIG. 5, a nitride-based semiconductor LED according to a third embodiment of the present invention is provided with a p-type contact layer 37 having a periodic corrugated shape on its surface, for extracting light from the side formed with the corrugated shape.

In the nitride-based semiconductor LED according to the third embodiment, circular portions (cylindrical projection or recess portions) 152 in the form of a (two-dimensional) triangular lattice corresponding to those shown in FIG. 2 are periodically formed on the surface of the p-type contact layer 37 of Mg-doped Ga$_{0.95}$In$_{0.05}$N. In this case, the distance D between each pair of adjacent circular portions (cylindrical projection or recess portions) 152 is set to 660 nm, and the diameter R of each circular portion (cylindrical projection or recess portion) 152 is set to 330 nm. The nitride-based semiconductor LED is designed on the assumption that the wavelength of light emitted from an emission layer is 380 nm. The p-type contact layer 37 is an example of the "semiconductor layer" in the present invention.

An ohmic electrode 38 of Ni having a thickness of about 2 nm is formed to cover the surface of the p-type contact layer 37 having the periodic corrugated shape. An electrode 39 of Ag exhibiting a high plasma frequency is formed to cover the ohmic electrode 38 with a thickness of about 3 nm. The ohmic electrode 38 of Ni is superior to the electrode 39 of Ag in ohmic property with respect to the p-type contact layer 37 of Mg-doped Ga$_{0.95}$In$_{0.05}$N. The electrode 39 consists of the metal (Ag) exhibiting a higher plasma frequency than the ohmic electrode 38 of Ni. The ohmic electrode 38 is an example of the "first electrode layer" in the present invention, and the electrode 39 is an example of the "second electrode layer" in the present invention.

The surface of the p-type contact layer 37 having the aforementioned periodic corrugated shape can be easily formed through photolithography and etching.

According to the third embodiment, as hereinabove described, the ohmic electrode 38 and the electrode 39 are so formed on the p-type contact layer 37 having the periodic corrugated shape in the form of a triangular lattice that the upper surface of the ohmic electrode 38 and the lower surface of the electrode 39 of Ag exhibiting a high plasma frequency are also periodically corrugated. Thus, the dielectric constant so periodically changes on the interface between the p-type contact layer 37 and the ohmic electrode 38 that the nitride-based semiconductor LED can excite surface plasmon with light emitted from the emission layer.

According to the third embodiment, further, the ohmic electrode 38 of Ni having an excellent ohmic property with respect to the p-type contact layer 37 is formed on the p-type contact layer 37 having the corrugated shape while the electrode 39, having the periodic structure, of Ag exhibiting a higher plasma frequency than the ohmic electrode 38 is formed on the ohmic electrode 38, whereby the nitride-based semiconductor LED can attain a surface plasmon effect through the electrode 39 while attaining excellent ohmic contact through the ohmic electrode 38.

According to the third embodiment, in addition, the ohmic electrode 38 of Ni has the extremely small thickness of about 1 nm so that the light emitted from an MQW emission layer 4 is transmitted through the electrode 39, having the periodic structure, of Ag exhibiting a high plasma frequency without remarkable attenuation through the ohmic electrode 38, whereby the nitride-based semiconductor LED can transmit light allowing sufficient excitation of surface plasmon on the surface side of the electrode 39.

The remaining effects of the third embodiment are similar to those of the first embodiment.

(Fourth Embodiment)

The structure of a semiconductor light-emitting device according to a fourth embodiment of the present invention is now described with reference to FIG. 6.

Figure 6:
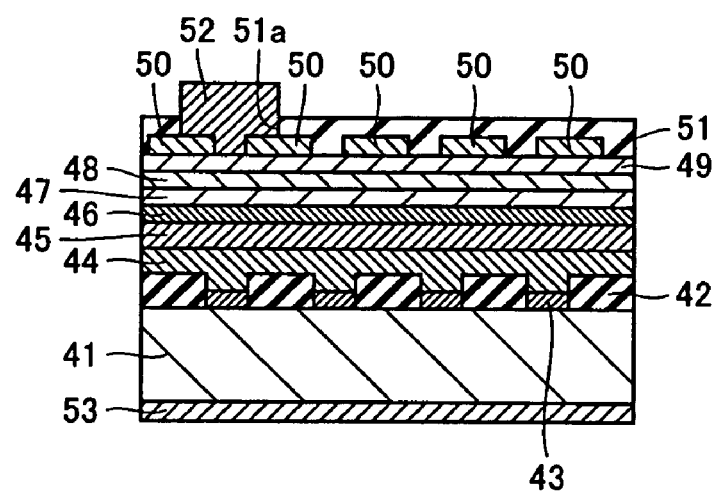
FIG. 6 is a sectional view showing the structure of a semiconductor light-emitting device (an LED or a vertical cavity semiconductor laser (VCSEL)) according to a fourth embodiment of the present invention.

In the semiconductor light-emitting device according to the fourth embodiment, a selective growth mask 42 of $SiO_2$ or $SiN_x$ having striped openings or hexagonal or circular interspersed openings is formed on a (111) Ga plane or a (111) plane of an n-type substrate 41 consisting of an n-type GaP substrate having the (111) Ga plane, an n-type GaAs substrate having the (111) Ga plane or an n-type Si substrate having the (111) plane, as shown in FIG. 6. Low-temperature buffer layers 43 of Si-doped non-single-crystalline GaN, AlGaN or AlN having a thickness of about 10 nm to about 50 nm are formed on surface portions of the n-type substrate 41 exposed between adjacent portions of the selective growth mask 42. An n-type layer 44 of single-crystalline Si-doped GaN having a thickness of about 5 $\mu$m is formed to cover the selective growth mask 42 and the low-temperature buffer layers 43. An n-type distributed bragg reflector (DBR) 45 obtained by alternately forming 10 single-crystalline Si-doped $Al_{0.2}Ga_{0.8}N$ layers each having a thickness of about 40 nm and 10 single-crystalline Si-doped GaN layers each having a thickness of about 40 nm is formed on the n-type layer 44. The thickness of each of the layers constituting the n-type DBR 45 is preferably set around $\lambda/(4m)$ assuming that m represents the refractive index of each layer and $\lambda$ represents the emission wavelength.

An n-type cladding layer 46 of single-crystalline Si-doped $Al_{0.1}Ga_{0.9}N$ having a thickness of about 0.15 $\mu$m is formed on the n-type DBR 45. A single quantum well (SQW) emission layer 47 having an SQW structure constituted of a well layer of single-crystalline undoped $Ga_{0.8}In_{0.2}N$ having a thickness of about 5 nm is formed on the n-type cladding layer 46. The SQW emission layer 47 is an example of the "emission layer" in the present invention. A contact layer 48 of undoped $Ga_{0.95}In_{0.05}N$ having a thickness of about 0.3 $\mu$m is formed on the SQW emission layer 47. The contact layer 48 is an example of the "semiconductor layer" in the present invention.

According to the fourth embodiment, an ohmic electrode 49 of Pt having a thickness of about 1 nm is formed on the overall surface of the contact layer 48. An electrode 50 of Al exhibiting a high plasma frequency is formed on the ohmic electrode 49 with a thickness of about 3 nm. The ohmic electrode 49 of Pt is superior to the electrode 50 of Al in ohmic property with respect to the contact layer 48 of undoped $Ga_{0.95}In_{0.05}N$. The electrode 50 consists of the metal (Al) exhibiting a higher plasma frequency than the ohmic electrode 18 of Pt. The ohmic electrode 49 is an example of the "first electrode layer" in the present invention, and the electrode 50 is an example of the "second electrode layer" in the present invention.

The electrode 50 is formed to have a periodic structure in the form of a (two-dimensional) triangular lattice so that portions formed with no electrode 50 define circular portions 152 similar to those shown in FIG. 2. Assuming that $\omega_L$ represents the angular frequency of the emission wavelength and $\epsilon_C$ represents the dielectric constant of the contact layer 48, the wave number $k_L$ of surface plasmon excited in the vicinity of the surface of the contact layer 48, the ohmic electrode 49 and the electrode 50 of Al is expressed as follows:

$$k_L^2 = (\omega_L/C)^2 \cdot \epsilon_A \epsilon_C/(\epsilon_A + \epsilon_C)$$

The distance D between the circular portions 152 similar to those shown in FIG. 2 is so satisfied that the wave number k of the surface plasmon satisfies the following expression:

$$k \approx (2/3^{0.5}) \cdot (2\pi/D)$$

As shown in FIG. 3, the magnitude G of the minimum reciprocal vector of the two-dimensional lattice (triangular lattice) formed in the fourth embodiment is expressed as follows:

$$G = 2(2/3^{0.5}) \cdot (2\pi/D)$$

The magnitude G of the minimum reciprocal vector and the wave number k of the surface plasmon substantially match with each other as described above, thereby easily forming a standing wave of the surface plasmon having the wave number k. According to the fourth embodiment, the distance D between each pair of adjacent circular portions 152 corresponding to those shown in FIG. 2 is set to 230 nm, and the diameter R of each circular portion 152 is set to 120 nm.

A protective layer 51 of $SiO_2$ having a thickness of several 100 nm is formed to cover the electrode 50 of Al exhibiting a high plasma frequency shown in FIG. 6. A pad electrode 52 of Au having a thickness of about 1 $\mu$m is formed through an opening 51a provided in the protective layer 51. An n-side electrode 53 is formed substantially on the overall back surface of the n-type substrate 41.

Also according to the fourth embodiment, the ohmic electrode 49 of Pt having an excellent ohmic property with respect to the contact layer 48 is formed on the overall surface of the contact layer 48 of undoped $Ga_{0.95}In_{0.05}N$ while the electrode 50, having the periodic structure, of Al exhibiting a higher plasma frequency than the ohmic electrode 49 is formed on the ohmic electrode 49, whereby the nitride-based semiconductor light-emitting device can attain a surface plasmon effect through the electrode 50 while attaining excellent ohmic contact through the ohmic electrode 49.

According to the fourth embodiment, further, the ohmic electrode 49 of Pt has the extremely small thickness of about 1 nm so that the light emitted from the SQW emission layer 47 is transmitted through the electrode 50, having the periodic structure, of Ag exhibiting a high plasma frequency without remarkable attenuation through the ohmic electrode 49, whereby the nitride-based semiconductor light-emitting device can transmit light allowing sufficient excitation of surface plasmon on the surface side of the electrode 50.

The remaining effects of the fourth embodiment are similar to those of the aforementioned first embodiment.

A fabrication process for the nitride-based semiconductor light-emitting device according to the fourth embodiment is described with reference to FIG. 6. First, the selective growth mask 42 of $SiO_2$ or $SiN_x$ having the striped openings or the hexagonal or circular interspersed openings is formed on the (111) Ga plane or the (111) plane of the n-type substrate 41 consisting of the n-type GaP substrate having the (111) Ga plane, the n-type GaAs substrate having the (111) Ga plane or the n-type Si substrate having the (111) plane. Then, the n-type substrate 41 is held at a temperature of about 400° C. to about 700° C., for forming the low-temperature buffer layers 43 of Si-doped non-single-crystalline GaN, AlGaN or AlN with the thickness of about 10 nm to about 50 nm with source gas of $NH_3$ and TMGa or TMAl and dopant gas of $SiH_4$. Thereafter the n-type substrate 41 is held at a single crystal growth temperature of about 1000° C. to about 1200° C. (about 1150° C., for example) for forming the n-type layer 44 of single-crystalline Si-doped GaN on the low-temperature buffer layers 43 and the selective growth mask 42 with carrier gas of $H_2$ and $N_2$ ($H_2$ content: about 50%), source gas of $NH_3$ and TMGa and dopant gas of $SiH_4$ at a growth rate of about 3 μm/h, to have the thickness of about 5 μm.

Thereafter the n-type substrate 41 is held at the single crystal growth temperature of about 1000° C. to about 1200° C. (about 1150° C., for example) for alternately forming the 10 single-crystalline Si-doped $Al_{0.2}Ga_{0.8}N$ layers each having the thickness of about 40 nm and the 10 single-crystalline Si-doped GaN layers each having the thickness of about 40 nm on the n-type layer 44 with carrier gas of $H_2$ and $N_2$ ($H_2$ content: about 1% to about 3%), source gas of $NH_3$, TMGa and TMAl and dopant gas of $SiH_4$ at a growth rate of about 3 μm/h, thereby forming the n-type DBR 45.

Thereafter the n-type substrate 41 is held at the single crystal growth temperature of about 1000° C. to about 1200° C. (about 1150° C., for example) for forming the n-type cladding layer 46 of single-crystalline Si-doped $Al_{0.1}Ga_{0.9}N$ on the n-type DBR 45 with carrier gas of $H_2$ and $N_2$ ($H_2$ content: about 1% to about 3%), source gas of $NH_3$, TMGa and TMAl and dopant gas of $SiH_4$ at a growth rate of about 3 μm/h, to have the thickness of about 0.15 μm.

Then, the n-type GaN substrate 41 is held at a single crystal growth temperature of about 700° C. to about 1000° C. (about 850° C., for example) for growing the well layer of single-crystalline undoped $Ga_{0.8}In_{0.2}N$ on the n-type cladding layer 46 with carrier gas of $H_2$ and $N_2$ ($H_2$ content: about 1% to about 5%) and source gas of $NH_3$, TEGa and TMIn at a growth rate of about 0.4 nm/s to have the thickness of about 5 nm, thereby forming the SQW emission layer 47. Further, the contact layer 48 of undoped $Ga_{0.95}In_{0.05}N$ is continuously formed at a growth rate of about 3 μm/h, to have the thickness of about 0.3 μm.

Thereafter the n-type substrate 41 is held at an annealing temperature of about 400° C. to about 900° C. (about 800° C., for example) for annealing the nitride-based semiconductors in a growth apparatus of an $N_2$ atmosphere, thereby reducing the hydrogen concentrations in the nitride-based semiconductors to not more than $5\times10^{18}$ cm$^{-3}$. Thereafter $Cp_2Mg$ employed as dopant gas is fed along with carrier gas of $N_2$ for diffusing Mg mainly into the contact layer 48 by $1\times10^{18}$ cm$^{-3}$ to $1\times10^{19}$ cm$^{-3}$, thereby converting the contact layer 48 to a the type.

Then, the ohmic electrode 49 of Pt is formed on the overall surface of the p-type contact layer 48, with the thickness of about 1 nm. The electrode 50, having the circular portions (circular holes) 152 similar to those shown in FIG. 2 in the form of a triangular lattice, of Al exhibiting a high plasma frequency is formed on the ohmic electrode 49 by a lift-off method with the thickness of about 3 nm. The protective layer 51 of $SiO_2$ having the thickness of several 100 nm is formed to cover the overall surface. Then, the opening 51a is formed in the protective layer 51, and the pad electrode 52 of Au is formed with the thickness of about 1 μm, to be in contact with the ohmic electrode 49 and the electrode 50. Thereafter the n-side electrode 53 is formed substantially on the overall back surface of the n-type substrate 41 by vacuum evaporation.

While the distance D is determined to satisfy the expression $k\approx(2/3^{0.5})\cdot(2\pi/D)$ in the fourth embodiment, this distance D may alternatively be determined to satisfy $k\approx\Gamma$ assuming that $\Gamma$ represents the magnitude of an arbitrary reciprocal vector similar to that appearing in FIG. 3.

(Fifth Embodiment)

Figure 7:
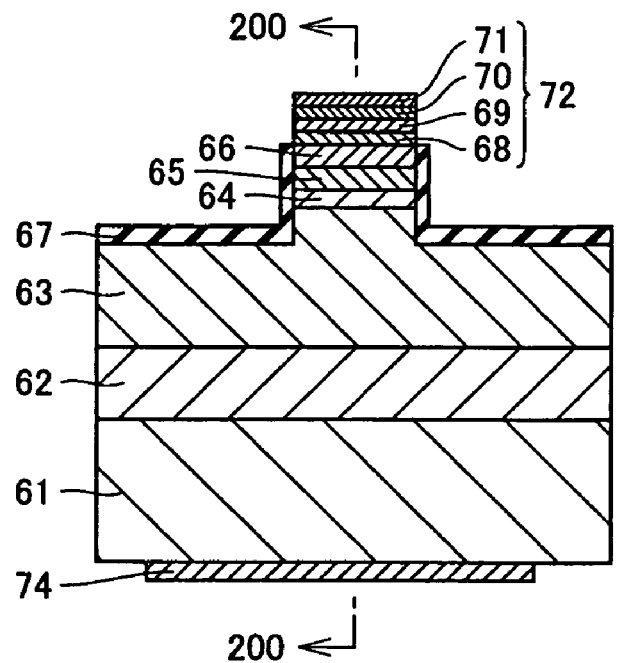
FIG. 7 is a sectional view showing a semiconductor laser having a waveguide structure according to a fifth embodiment of the present invention.
Figure 8:
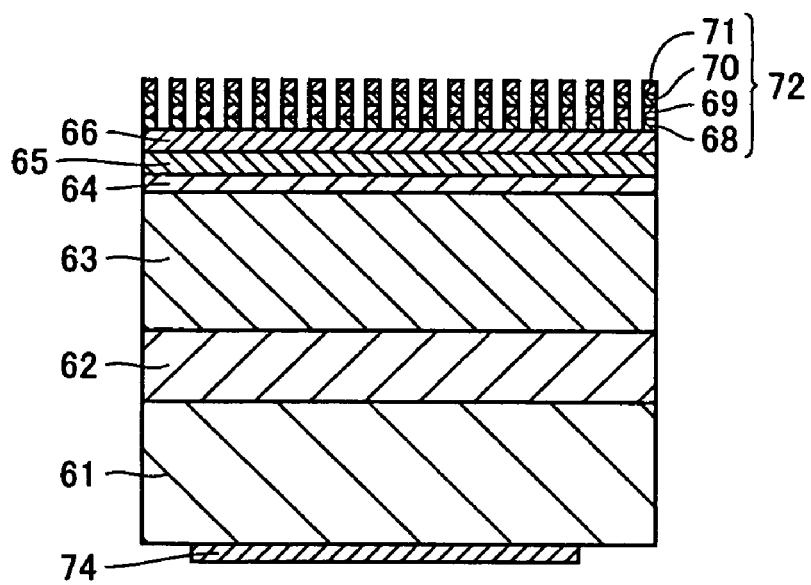
FIG. 8 is a sectional view of the semiconductor laser having a waveguide structure according to the fifth embodiment taken along the line 200–200 in FIG. 7.

Referring to FIGS. 7 and 8, a fifth embodiment of the present invention is applied to a nitride-based semiconductor laser device having a waveguide structure.

In the nitride-based semiconductor laser device according to the fifth embodiment, an n-type layer 62 of single-crystalline Si-doped GaN having a thickness of about 5 μm is formed on the (0001) Ga plane of an n-type GaN substrate 61, doped with oxygen or Si, having a thickness of about 200 μm to about 400 μm, as shown in FIG. 7. An n-type cladding layer 63 of single-crystalline Si-doped $Al_{0.1}Ga_{0.9}N$ having a thickness of about 0.15 μm is formed on the n-type layer 62. This n-type cladding layer 63 is formed to have a projection portion on the center thereof. An MQW emission layer 64 having an MQW structure prepared by alternately forming six barrier layers of single-crystalline undoped GaN each having a thickness of about 5 nm and five well layers of single-crystalline undoped $Ga_{0.9}In_{0.1}N$ each having a thickness of about 5 nm is formed on the projection portion of the n-type cladding layer 63. The MQW emission layer 64 is an example of the "emission layer" in the present invention. A protective layer 65 of single-crystalline Mg-doped $Al_{0.1}Ga_{0.9}N$ having a thickness of about 5 nm is formed on the protective layer 65. A p-type contact layer 66 of single-crystalline Mg-doped GaN having a thickness of about 5 nm is formed on the protective layer 65. The p-type contact layer 66 is an example of the "semiconductor layer" in the present invention. The projection portion of the n-type cladding layer 63, the MQW emission layer 64, the protective layer 65 and the p-type contact layer 66 constitute a ridge portion.

According to the fifth embodiment, a p-side electrode layer 72 having a striped (one-dimensional) periodic structure is formed on the ridge portion (p-type contact layer 66), as shown in FIG. 8. This p-side electrode layer 72 is constituted of an ohmic electrode 68 of Pd having a thickness of about 1 nm formed to be in ohmic contact with the upper surface of the p-type contact layer 66, an electrode 69 of Ag exhibiting a high plasma frequency formed on the ohmic electrode 68 with a thickness of about 200 nm, a barrier layer 70 of indium tin oxide (ITO) or the like formed on the electrode 69 with a thickness of about 100 nm and a pad electrode 71 of Au formed on the barrier layer 70 with a thickness of about 100 nm. The ohmic electrode 68 of Pd is superior to the electrode 69 of Ag in ohmic property with respect to the p-type contact layer 66 of Mg-doped GaN. The electrode 69 consists of the metal (Ag) exhibiting a higher plasma frequency than the ohmic electrode 68 of Pd. The ohmic electrode 68 is an example of the "first electrode layer" in the present invention, and the electrode 69 is an example of the "second electrode layer" in the present invention. A portion close to the surface of the p-type contact layer 66, the ohmic electrode 68 and the electrode 69 of Ag functions as a striped waveguide with respect to surface plasmon.

The barrier layer 70 is provided for suppressing reaction between the ohmic electrode 68 and the pad electrode 71. Thus, the nitride-based semiconductor laser device suppresses reduction of the plasma frequency as well as increase of light absorption.

Assuming that $\omega_L$ represents the angular frequency of the emission wavelength and $\epsilon_C$ represents the dielectric constant of the p-type contact layer 66, the wave number $k_L$ of surface plasmon excited in the vicinity of the surface of the p-type contact layer 66, the ohmic electrode 68 and the electrode 69 of Al is expressed as follows:

$$k_L{}^2=(\omega_L/C)^2 \cdot \epsilon_A \epsilon_C/(\epsilon_A+\epsilon_C)$$

According to the fifth embodiment, the one-dimensional period (distance between adjacent portions of the p-side electrode layer 72 shown in FIG. 8) D is so determined that the wave number $k_L$ satisfies the following expression:

$$k_L \approx 2\pi/D$$

In this case, the magnitude G of the minimum reciprocal vector of the one-dimensional lattice is expressed as follows:

$$G=2\pi/D$$

Thus, the magnitude G of the minimum reciprocal vector and the wave number $k_L$ of the surface plasmon substantially match with each other, thereby easily forming a standing wave of the surface plasmon having the wave number $k_L$ in the waveguide along the direction of the stripes. According to the fifth embodiment, the period D of the one-dimensional lattice is set to 170 nm. The nitride-based semiconductor laser device according to the fifth embodiment emits the standing wave of the surface plasmon from a striped end surface of the ridge portion as a laser beam.

An n-side electrode 74 constituted of an ohmic electrode of Al, a barrier metal layer of Pt or Ti and a pad electrode of Au or Au—Sn from the side closer to the n-type GaN substrate 61 is formed on the back surface of the n-type GaN substrate 61.

According to the fifth embodiment, as hereinabove described, the nitride-based semiconductor laser device, provided with the electrode 69 of Ag exhibiting a high plasma frequency in the periodic striped (one-dimensional) shape, can excite surface plasmon with light emitted from the MQW emission layer 64.

According to the fifth embodiment, further, the ohmic electrode 68, having the striped (one-dimensional) periodic structure, of Pd having an excellent ohmic property with respect to the p-type contact layer 66 is formed on the p-type contact layer 66 while the electrode 69, having the striped (one-dimensional) periodic structure, of Ag exhibiting a higher plasma frequency than the ohmic electrode 68 is formed on the ohmic electrode 68, whereby the nitride-based semiconductor laser device can attain a surface plasmon effect through the electrode 69 while attaining excellent ohmic contact through the ohmic electrode 68.

According to the fifth embodiment, in addition, the ohmic electrode 68 of Pd has the extremely small thickness of about 1 nm so that the light emitted from the MQW emission layer 64 is transmitted through the electrode 69, having the periodic structure, of Ag exhibiting a high plasma frequency without remarkable attenuation through the ohmic electrode 68, whereby the nitride-based semiconductor laser device can transmit light allowing sufficient excitation of surface plasmon in the vicinity of the surface of the p-type contact layer 66, the ohmic electrode 68 and the electrode 69 of Ag.

A fabrication process for the nitride-based semiconductor laser device having a waveguide structure according to the fifth embodiment is described with reference to FIGS. 7 and 8. First, the n-type GaN substrate 61, doped with oxygen or Si, having the (0001) Ga plane is prepared with the thickness of about 200 μm to about 400 μm. Thereafter the n-type GaN substrate 61 is held at a single crystal growth temperature of about 1000° C. to about 1200° C. (about 1150° C., for example) for forming the n-type layer 62 of single-crystalline Si-doped GaN on the (0001) Ga plane of the n-type GaN substrate 61 with carrier gas of $H_2$ and $N_2$ ($H_2$ content: about 50%), source gas of $NH_3$ and TMGa and dopant gas of $SiH_4$ at a growth rate of about 3 μm/h, to have the thickness of about 5 μm. Thereafter the n-type GaN substrate 61 is held at the single crystal growth temperature of about 1000° C. to about 1200° C. (about 1150° C., for example) for growing the n-type cladding layer 63 of single-crystalline Si-doped $Al_{0.1}Ga_{0.9}N$ on the n-type layer 62 with carrier gas of $H_2$ and $N_2$ ($H_2$ content: about 1% to about 3%), source gas of $NH_3$, TMGa and TMAl and dopant gas of $SiH_4$ at a growth rate of about 3 μm/h, to have the thickness of about 0.15 μm.

Then, the n-type GaN substrate 61 is held at a single crystal growth temperature of about 700° C. to about 1000° C. (about 850° C., for example) for alternately forming the six barrier layers of single-crystalline undoped GaN each having the thickness of about 5 nm and the five well layers of single-crystalline undoped $Ga_{0.9}In_{0.1}N$ each having the thickness of about 5 nm on the n-type cladding layer 63 with carrier gas of $H_2$ and $N_2$ ($H_2$ content: about 1% to about 3%) and source gas of $NH_3$, TEGa and TMIn at a growth rate of about 4 nm/s, thereby forming the MQW emission layer 64. Further, the protective layer 65 of single-crystalline Mg-doped $Al_{0.1}Ga_{0.9}N$ is continuously formed at a growth rate of about 0.4 nm/s, to have the thickness of about 5 nm.

Thereafter the n-type GaN substrate 61 is held at a single crystal growth temperature of about 1000° C. to about 1200° C. (about 1150° C., for example) for growing the p-type contact layer 66 of single-crystalline Mg-doped GaN on the protective layer 65 with carrier gas of $H_2$ and $N_2$ ($H_2$ content: about 1% to about 3%), source gas of $NH_3$, TMGa and TMAl and dopant gas of $Cp_2Mg$ at a growth rate of about 3 μm/h, to have the thickness of about 5 nm.

In the aforementioned crystal growth of the protective layer 65 and the p-type contact layer 66, the carrier gas is so set to the low hydrogen composition of about 1% to about 3% as to obtain the p-type semiconductor layers (the protective layer 65 and the p-type contact layer 66) having high carrier concentrations by activating the Mg dopant with no heat treatment in an $N_2$ atmosphere.

Thereafter the ridge portion shown in FIG. 7 is formed by partially etching the p-type contact layer 66, the protective layer 65, the MQW emission layer 64 and the n-type cladding layer 63 by photolithography and etching. Insulator films 67 are formed to cover the side surfaces of the ridge portion and the upper surface of the n-type cladding layer 63.

Thereafter the p-side electrode layer 72 having the striped (one-dimensional) periodic structure is formed on the upper surface of the p-type contact layer 66. More specifically, a resist film (not shown) is formed on the overall surface and a portion of this resist film corresponding to that formed with the p-side electrode layer 72 is removed. Thereafter a Pd layer having a thickness of about 1 nm, an Ag layer having a thickness of about 200 nm, an ITO film having a thickness of about 100 nm and an Au layer having a thickness of about 100 nm are successively formed by vacuum evaporation followed by removal of the resist film, thereby forming the p-side electrode layer 72 having the striped (one-dimensional) periodic structure as shown in FIG. 8.

Thereafter the n-side electrode 74 constituted of the ohmic electrode of Al, the barrier metal layer of Pt or Ti and the pad electrode of Au or Au—Sn is formed on the back surface of the n-type GaN substrate 61 by vacuum evaporation. Thus, the nitride-based semiconductor laser device having a waveguide structure according to the fifth embodiment is formed.

(Sixth Embodiment)

Figure 9:
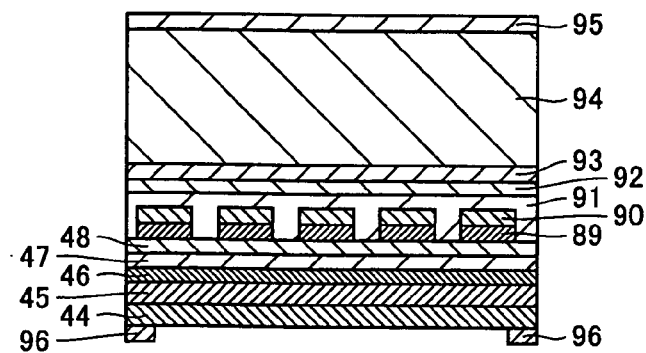
FIG. 9 is a sectional view showing the structure of a semiconductor light-emitting device (an LED or a VCSEL) according to a sixth embodiment of the present invention.

Referring to FIG. 9, a sixth embodiment of the present invention is applied to a semiconductor light-emitting device such as a semiconductor LED or a VCSEL extracting light from a surface opposite to an electrode 90 periodically formed on its front surface for attaining a surface plasmon effect.

In the semiconductor light-emitting device according to the sixth embodiment, an n-type layer 44, an n-type DBR 45, an n-type cladding layer 46, an SQW emission layer 47 and a contact layer 48 having thicknesses and compositions similar to those according to the fourth embodiment shown in FIG. 5 are formed as shown in FIG. 9. An ohmic electrode 89 of Pd having a thickness of about 1 nm and the electrode 90 of Ag exhibiting a high plasma frequency with a thickness of about 200 nm are formed on the upper surface of the contact layer 48 of undoped $Ga_{0.95}In_{0.05}N$ in a periodic structure in the form of a triangular lattice having circular portions 152, formed with no electrodes 89 and 90, similar to those shown in FIG. 2. The ohmic electrode 89 is superior to the electrode 90 of Ag in ohmic property with respect to the contact layer 48 of undoped $Ga_{0.95}In_{0.05}N$. The electrode 90 consists of the metal (Ag) exhibiting a higher plasma frequency than the ohmic electrode 89 of Pd. The ohmic electrode 89 is an example of the "first electrode layer" in the present invention, and the electrode 90 is an example of the "second electrode layer" in the present invention.

A barrier layer 91 of ITO or the like having a thickness of about 100 nm is formed to cover the ohmic electrode 89 and the electrode 90. A pad electrode 92 of Au having a thickness of about 100 nm is formed on the barrier layer 91. A support substrate 94 having a thickness of about 200 μm to about 1 mm is mounted on the pad electrode 92 through an electrode 93. This support substrate 94 consists of a p-type diamond substrate, an n-type SiC substrate or a polycrystalline n-type AlN substrate. A p-side electrode 95 is formed on the upper surface of the support substrate 94. An n-side electrode 96 is formed on a chip peripheral region of about 50 μm on the back surface of the n-type layer 44. This n-side electrode 96 is constituted of an ohmic electrode of Al, a barrier metal layer of Pt or Ti and a pad metal layer of a fusible metal such as Au or Au—Sn from the side closer to the n-type layer 44.

According to the sixth embodiment, the ohmic electrode 89 and the electrode 90 of Ag exhibiting a high plasma frequency are so periodically formed that the circular portions 152, formed with no electrodes 89 and 90, similar to those shown in FIG. 2 are in the form of a triangular lattice, thereby easily forming a standing wave of surface plasmon having a wave number k similarly to the aforementioned fourth embodiment. According to the sixth embodiment, the distance D between each pair of adjacent circular portions 152 corresponding to those shown in FIG. 2 is set to 230 nm and the diameter R of each circular portion 152 is set to 120 nm, similarly to the fourth embodiment. Assuming that $\omega_L$ represents the angular frequency of the emission wavelength and $\epsilon_C$ represents the dielectric constant of the contact layer 48, the wave number $k_L$ of surface plasmon excited in the vicinity of the contact layer 48, the ohmic electrode 89 and the electrode 90 of Ag is expressed as follows:

$$k_L{}^2 = (\omega_L/C)^2 \cdot \epsilon_A \epsilon_C / (\epsilon_A + \epsilon_C)$$

Also according to the sixth embodiment, the electrode 90 of Ag exhibiting a high plasma frequency is so periodically formed similarly to the aforementioned fourth embodiment that the semiconductor light-emitting device can excite surface plasmon with light emitted from the SQW emission layer 47. According to the sixth embodiment, further, the ohmic electrode 89, having the periodic structure, of Pd having an excellent ohmic property with respect to the contact layer 48 is formed on the overall surface of the contact layer 48 of undoped $Ga_{0.95}In_{0.05}N$ while the electrode 90, having the periodic structure, of Ag exhibiting a higher plasma frequency than the ohmic electrode 89 is formed on the ohmic electrode 89, whereby the semiconductor light-emitting device can attain a surface plasmon effect through the electrode 90 while attaining excellent ohmic contact through the ohmic electrode 89.

According to the sixth embodiment, in addition, the ohmic electrode 89 of Pd has the extremely small thickness of about 1 nm so that the light emitted from the SQW emission layer 47 is transmitted through the electrode 90, having the periodic structure, of Ag exhibiting a high plasma frequency without remarkable attenuation through the ohmic electrode 89, whereby the semiconductor light-emitting device can transmit light allowing sufficient excitation of surface plasmon on the surface side of the electrode 90.

Figure 10:
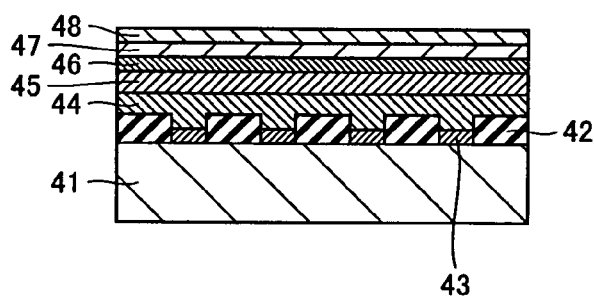
FIGS. 10 and 11 are sectional views for illustrating a fabrication process for the semiconductor light-emitting device according to the sixth embodiment shown in FIG. 9.

A fabrication process for the semiconductor light-emitting device according to the sixth embodiment is described with reference to FIGS. 9 to 11. First, a selective growth mask 42, low-temperature buffer layers 43, the n-type layer 44, the n-type DBR 45, the n-type cladding layer 46, the SQW emission layer 47 and the contact layer 48 are successively grown on an n-type substrate 41 as shown in FIG. 10, through a step similar to that for forming the semiconductor light-emitting device according to the fourth embodiment shown in FIG. 5.

Figure 11:
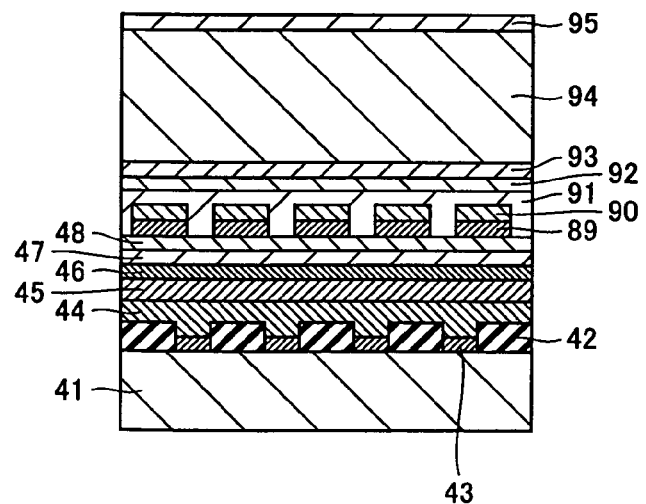

Thereafter the ohmic electrode 89 and the electrode 90 are formed on the contact layer 48 in the periodic structure in the form of a triangular lattice similar to that shown in FIG. 2 by a lift-off method, as shown in FIG. 11. More specifically, a resist film is formed on the overall surface and partially removed from portions for forming the electrodes 89 and 90. Thereafter a Pd layer having a thickness of about 1 nm and an Ag layer having a thickness of about 200 nm are successively formed and the resist film is removed, thereby forming the ohmic electrode 89 and the electrode 90 exhibiting a high plasma frequency in the periodic structure in the form of a triangular lattice with the circular portions (circular holes) 152, formed with no electrodes 89 and 90, similar to those shown in FIG. 2.

Thereafter the barrier layer 91 of ITO or the like having the thickness of about 100 nm is formed to cover the overall surface. The pad electrode 92 of Au having the thickness of about 100 nm is formed on the barrier layer 91 by vacuum evaporation. Thereafter the semiconductor light-emitting device is bonded to the conductive support substrate 94 formed with the electrodes 93 and 95 on the front and back surfaces respectively through the pad electrode 92. In this case, the shapes of the support substrate 94 and the n-type substrate 41 formed with the semiconductor light-emitting device are preferably substantially equal to each other. Thereafter the n-type substrate 41 provided on the back surface is removed by wet etching or the like for exposing the low-temperature buffer layers 43. Further, the back surface is polished to remove the low-temperature buffer layers 43 and the selective growth mask 42, thereby exposing the back surface of the n-type layer 44. Thus, the shape shown in FIG. 9 is obtained. Thereafter the ohmic electrode, the barrier metal layer and the pad metal layer are successively stacked on the chip peripheral region of about 50 μm of the n-type layer 44, thereby forming the n-side electrode 96. Thus, the semiconductor light-emitting device according to the sixth embodiment is formed.

(Seventh Embodiment)

Figure 12:
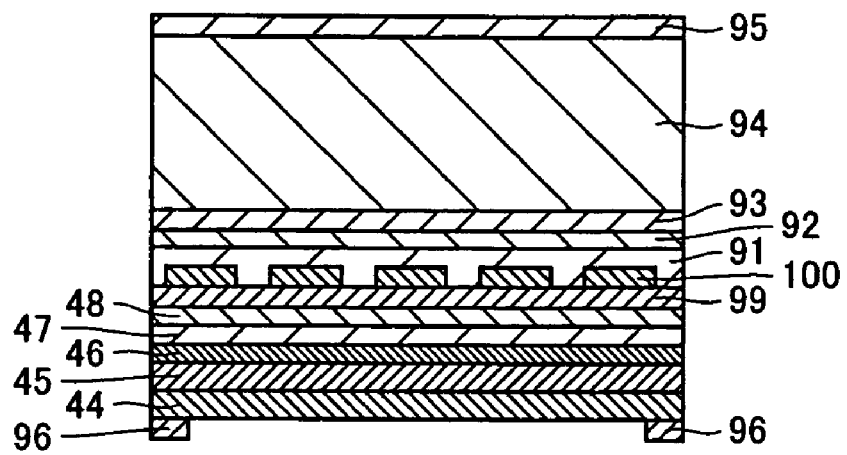
FIG. 12 is a sectional view showing the structure of a semiconductor light-emitting device (an LED or a VCSEL) according to a seventh embodiment of the present invention.

Referring to FIG. 12, an ohmic electrode 99 is formed on the overall surface of a contact layer 48 while an electrode 100 of a metal exhibiting a high plasma frequency is formed on the ohmic electrode 99 in a periodic structure in a semiconductor light-emitting device according to a seventh embodiment of the present invention, dissimilarly to the aforementioned sixth embodiment. The remaining structure of the seventh embodiment is similar to that of the sixth embodiment.

According to the seventh embodiment, the ohmic electrode 99 of Pt having a thickness of about 1 nm is formed on the overall surface of the contact layer 48. The electrode 100 of Al, exhibiting a high plasma frequency, having a thickness of about 100 nm is formed on the ohmic electrode 99 in the periodic structure in the form of a triangular lattice with circular portions 152, formed with no electrode 100, similar to those shown in FIG. 2. The ohmic electrode 99 of Pt is superior to the electrode 100 of Al in ohmic property with respect to the contact layer 48 of undoped $Ga_{0.95}In_{0.05}N$. The electrode 100 consists of the metal (Al) exhibiting a higher plasma frequency than the ohmic electrode 89 of Pt. The ohmic electrode 99 is an example of the "first electrode layer" in the present invention, and the electrode 100 is an example of the "second electrode layer" in the present invention.

According to the seventh embodiment, the distance D between each pair of adjacent circular portions 152 similar to those shown in FIG. 2 is so determined that a wave number $k_L$ satisfies the following expression:

$$k_L \approx 2(2/3^{0.5}) \cdot 2\pi/D$$

In this case, a magnitude $G(=2(2/3^{0.5}) \cdot (2\pi/D))$ matches with the magnitude of reciprocal vectors of a two-dimensional lattice (triangular lattice). According to the seventh embodiment, the distance D is set to 460 nm and the diameter R of each circular portion 152 is set to 240 nm.

Also according to the seventh embodiment, the semiconductor light-emitting device can attain a surface plasmon effect through the electrode 100 exhibiting a high plasma frequency with the periodic structure while attaining excellent ohmic contact with the contact layer 48 through the ohmic electrode 99, similarly to the aforementioned sixth embodiment.

The remaining effects of the seventh embodiment are similar to those of the sixth embodiment.

A fabrication process for the semiconductor light-emitting device according to the seventh embodiment is described with reference to FIGS. 12 and 13.

Figure 13:
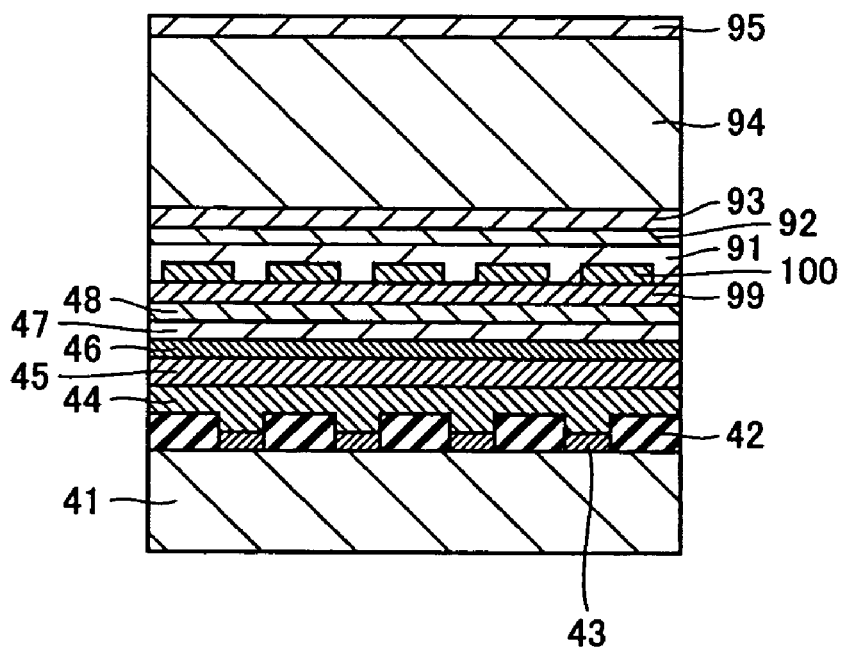
FIG. 13 is a sectional view for illustrating a fabrication process for the semiconductor light-emitting device according to the seventh embodiment shown in FIG. 12.

First, the layers up to the contact layer 48 shown in FIG. 13 are formed through a process similar to that of the sixth embodiment shown in FIGS. 10 and 11. Thereafter a Pt film is formed on the overall surface of the contact layer 48 by vacuum evaporation with a thickness of about 1 nm, thereby forming the ohmic electrode 99. Then, the electrode 100 of Al exhibiting a high plasma frequency is formed on the ohmic electrode 99 with the thickness of about 100 nm by a lift-off method. Thereafter the semiconductor light-emitting device according to the seventh embodiment is formed as shown in FIG. 12, through a process similar to that of the sixth embodiment described with reference to FIGS. 11 and 9.

(Eighth Embodiment)

Figure 14:
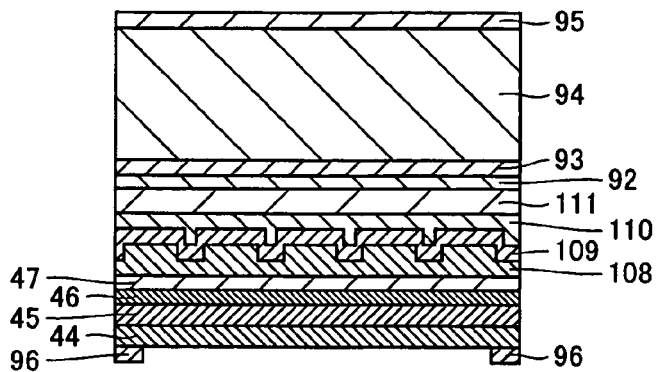
FIG. 14 is a sectional view showing the structure of a semiconductor light-emitting device (an LED or a VCSEL) according to an eighth embodiment of the present invention.

Referring to FIG. 14, the upper surface of a contact layer 108 has a periodic corrugated shape in a semiconductor light-emitting device according to an eighth embodiment of the present invention, dissimilarly to the aforementioned sixth embodiment. The remaining structure of the eighth embodiment is similar to that of the sixth embodiment.

In the semiconductor light-emitting device according to the eighth embodiment, the surface of the contact layer 108 of undoped $Ga_{0.95}In_{0.05}N$ having a thickness of about 0.3 μm formed on an SQW emission layer 47 has the periodic corrugated shape. The contact layer 108 is an example of the "semiconductor layer" in the present invention. In this case, the depth of recess portions is set to about 20 nm, for example. This corrugated shape is provided with circular portions 152 similar to those shown in FIG. 2 in the form of a triangular lattice as projection or recess portions. In this case, the distance D between each pair of adjacent circular portions 152 similar to those shown in FIG. 2 is set to 460 nm, and the diameter R of each circular portion 152 is set to 240 nm.

An ohmic electrode 109 of Ni having a thickness of about 2 nm is formed to cover the overall surface of the contact layer 108 having the aforementioned corrugated shape. An electrode 110 of Ag exhibiting a high plasma frequency is formed on the ohmic electrode 109 with a thickness of about 300 nm. The ohmic electrode 109 of Ni is superior to the electrode 110 of Ag in ohmic property with respect to the contact layer 108 of undoped $Ga_{0.95}In_{0.05}N$. The electrode 110 consists of the metal (Ag) exhibiting a higher plasma frequency than the ohmic electrode 109 of Ni. The ohmic electrode 109 is an example of the "first electrode layer" in the present invention, and the electrode 110 is an example of the "second electrode layer" in the present invention.

According to the eighth embodiment, as hereinabove described, the surface of the contact layer 108 has the periodic corrugated shape while the ohmic electrode 109 and the electrode 110 of the metal exhibiting a high plasma frequency are successively formed on the periodic corrugated shape so that the lower surface of the electrode 110 of Ag exhibiting a high plasma frequency also has a periodic corrugated shape, whereby the semiconductor light-emitting device can easily attain a surface plasmon effect. Also according to the eighth embodiment, the semiconductor light-emitting device can attain the surface plasmon effect through the electrode 110 of Ag exhibiting a high plasma frequency while attaining excellent ohmic contact with the contact layer 108 through the ohmic electrode 109.

The remaining effects of the eighth embodiment are similar to those of the sixth embodiment.

Figure 15:
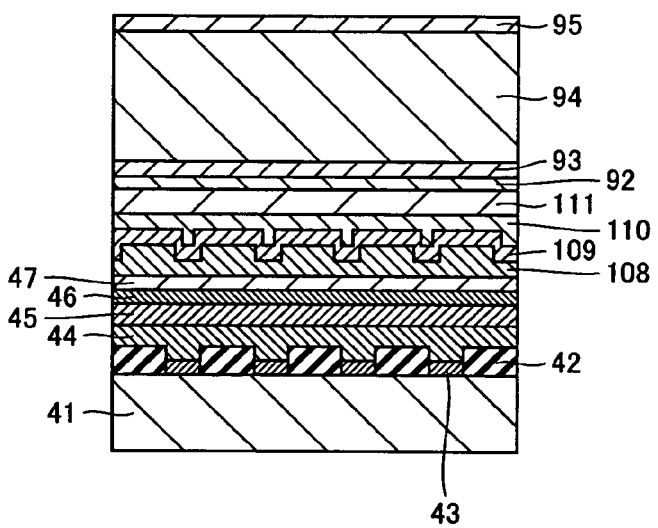
FIG. 15 is a sectional view for illustrating a fabrication process for the semiconductor light-emitting device according to the eighth embodiment shown in FIG. 14.

A fabrication process for the semiconductor light-emitting device according to the eighth embodiment is described with reference to FIGS. 14 and 15. First, layers up to an SQW emission layer 47 are formed through a process similar to that of the sixth embodiment shown in FIG. 10. Thereafter the contact layer 108 of undoped $Ga_{0.95}In_{0.05}N$ having the thickness of about 0.3 μm is formed on the SQW emission layer 47. The periodic corrugated shape is formed on the surface of the contact layer 108 in the form of a triangular lattice similar to that shown in FIG. 2 through photolithography and etching, as shown in FIG. 15. Thereafter the ohmic electrode 109 of Ni having the thickness of about 2 nm, the electrode 110 of Ag exhibiting a high plasma frequency with the thickness of about 300 nm and a barrier layer 111 of ITO or the like having a thickness of about 100 nm are formed on the contact layer 108 by vacuum evaporation. Thereafter the semiconductor light-emitting device according to the eighth embodiment is completed as shown in FIG. 14, through processes similar to those of the sixth embodiment described with reference to FIGS. 11 and 9.

(Ninth Embodiment)

Figure 16:
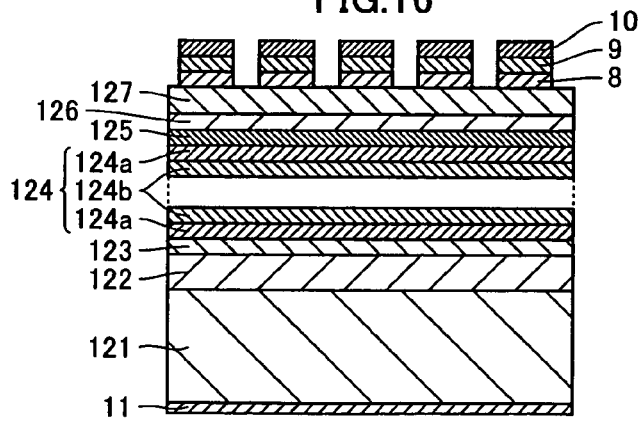
FIG. 16 is a sectional view showing the structure of a semiconductor LED according to a ninth embodiment of the present invention.

Referring to FIG. 16, a ninth embodiment of the present invention is applied to a semiconductor LED employing ZnO-based materials in a structure similar of that of the first embodiment shown in FIG. 1.

In the semiconductor LED according to the ninth embodiment, an n-type layer 122 of Ga-doped n-type ZnO having a thickness of about 4 μm is formed on the (0001) Zn plane of an n-type ZnO substrate 121, as shown in FIG. 16. An n-type cladding layer 123 of Ga-doped n-type $Mg_{0.05}Zn_{0.95}O$ is formed on the n-type layer 122. An MQW emission layer 124 having an MQW structure prepared by alternately stacking three well layers 124a of $Cd_{0.1}Zn_{0.9}O$ and two barrier layers 124b of $Mg_{0.05}Zn_{0.95}$ is formed on the n-type cladding layer 123. The MQW emission layer 124 is an example of the "emission layer" in the present invention.

A p-type carrier blocking layer 125 of nitrogen-doped p-type $Mg_{0.15}Zn_{0.85}O$ having a thickness of about 20 nm is formed on the MQW emission layer 124. A p-type cladding layer 126 of nitrogen-doped p-type $Mg_{0.05}Zn_{0.95}O$ having a thickness of about 0.2 μm is formed on the p-type carrier blocking layer 125. A p-type contact layer 127 of nitrogen-doped p-type ZnO having a thickness of about 0.15 μm is formed on the p-type cladding layer 126. The p-type contact layer 127 is an example of the "semiconductor layer" in the present invention.

According to the ninth embodiment, an ohmic electrode 8 of Pd having a thickness of about 1 nm, an electrode 9 of Ag exhibiting a high plasma frequency with a thickness of about 2 nm and a protective layer 10 of Au having a thickness of about 1 nm are formed on the p-type contact layer 127 in the form of a periodic triangular lattice with circular portions 152, formed with no electrodes 8 and 9 etc., similar to those shown in FIG. 2. The ohmic electrode 8 of Pd, provided for attaining excellent ohmic contact with the p-type contact layer 127 of nitrogen-doped p-type ZnO, is superior to the electrode 9 in ohmic property with respect to the p-type contact layer 127. The electrode 9, provided for attaining a surface plasmon effect similarly to that in the first embodiment, is made of the metal (Ag) exhibiting a higher plasma frequency than the ohmic electrode 8 of Pd.

An n-side electrode 11 constituted of an ohmic electrode of Al or Ag, a barrier metal layer of Pt or Ti and a pad metal layer of Au or Au—Sn is formed on the back surface of the n-type ZnO substrate 121, similarly to the first embodiment.

Also according to the ninth embodiment, a p-side electrode structure similar to that of the aforementioned firs embodiment is provided so that the semiconductor LED employing the ZnO-based materials can also attain a surface plasmon effect through the electrode 9 of Ag exhibiting a high plasma frequency with the periodic structure while attaining excellent ohmic contact with the contact layer 127 through the ohmic electrode 8.

In a fabrication process for the semiconductor LED according to the ninth embodiment, the n-type ZnO substrate 121 having a thickness of about 200 μm to about 400 μm is prepared as shown in FIG. 16. Then, the n-type layer 122 of Ga-doped n-type ZnO is grown on the (0001) Zn plane of the n-type ZnO substrate 121 by MOVPE with carrier gas of hydrogen at a growth temperature of about 500° C. to about 700° C. and a growth rate of about 0.08 μm, to have the thickness of about 4 μm. The n-type cladding layer 123 of Ga-doped n-type $Mg_{0.05}Zn_{0.950}$ is grown on the n-type layer 122 at a growth temperature of about 500° C. to about 700° C. to have the thickness of about 0.45 μm. Further, the three well layers 124a of $Cd_{0.1}Zn_{0.9}O$ and the two barrier layers 124b of $Mg_{0.05}Zn_{0.95}O$ are alternately grown on the n-type cladding layer 123 at a growth temperature of about 400° C. to about 450° C., thereby forming the MQW emission layer 124.

Thereafter the p-type carrier blocking layer 125 of nitrogen-doped p-type $Mg_{0.15}Zn_{0.85}O$ having the thickness of about 20 nm and the p-type cladding layer 126 of nitrogen-doped p-type $Mg_{0.05}Zn_{0.95}O$ having the thickness of about 0.2 μm are successively grown on the MQW emission layer 124 at a growth temperature of about 500° C. to about 700° C. The p-type contact layer 127 of nitrogen-doped p-type ZnO having the thickness of about 0.15 μm is grown on the p-type cladding layer 126 at a growth temperature of about 500° C. to about 700° C. After the growth of the p-type contact layer 127, annealing is performed in an atmosphere of inert gas such as nitrogen or argon or in a vacuum under a temperature condition of about 700° C., thereby desorbing hydrogen contained in the semiconductor layers. Thus, carrier concentrations of the p layers (the p-type carrier blocking layer 125, the p-type cladding layer 126 and the p-type contact layer 127) are increased.

Thereafter the ohmic electrode 8, the electrode 9 and the protective layer 10 are formed while the n-side electrode 11 is formed on the back surface of the n-type ZnO substrate 121 through a process similar to that for the semiconductor LED according to the first embodiment shown in FIG. 1. Thus, the semiconductor LED (LED) according to the ninth embodiment is completed.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to a semiconductor light-emitting device consisting of nitride-based semiconductors or a semiconductor light-emitting device consisting of ZnO-based materials in each of the aforementioned embodiments, the present invention is not restricted to this but is also applicable to a semiconductor light-emitting device consisting of other materials. However, the present invention is preferably applied to a semiconductor light-emitting device emitting short-wavelength light.

While the layers of nitride-based semiconductors or ZnO-based materials are stacked on a hexagonal C plane in each of the aforementioned first to third, fifth and ninth embodiments, the present invention is not restricted to this but the layers may alternatively be stacked on a plane of another hexagonal orientation. For example, the layers may be stacked on a (H, K, -H-K, 0) plane such as a (1–100) or (11–20) plane, for example. In this case, the emission layer generates no piezoelectric field, whereby the emission efficiency thereof can be improved. Further alternatively, the substrate may be off from each plane orientation.

While the emission layer has an MQW or SQW structure in each of the aforementioned embodiments, the present invention is not restricted to this but effects similar to the above can be attained also through a structure having a thick single layer.

Each semiconductor may have a wurtzite or zinc blende crystal structure in each of the aforementioned first to ninth embodiments.

While each layer of the nitride-based semiconductor or the ZnO-based material is grown by MOVPE or the like in each of the aforementioned embodiments, the present invention is not restricted to this but crystal growth may alternatively be made by HVPE (halide vapor phase epitaxy), MBE (molecular beam epitaxy), gas source MBE or the like.

While the periodic structure is in the form of a (two-dimensional) triangular lattice shown in FIG. 2 or a striped (one-dimensional) periodic structure shown in FIG. 8 in each of the aforementioned embodiments, the present invention is not restricted to this but still another periodic structure may alternatively be employed. For example, effects similar to the above can be attained by two-dimensionally periodically arranging portions formed with no electrodes, portions formed with electrodes or corrugated portions in the form of a square lattice, a rectangular lattice or an oblique lattice other than the triangular lattice. Referring to FIG. 2, the electrodes 8 and 9 may be formed not on the hatched regions 151 but only on the circular portions 152.

What is claimed is:

1. A semiconductor light-emitting device comprising:
a semiconductor layer formed on an emission layer;
a first electrode layer formed on said semiconductor layer; and
a second electrode layer, formed on said first electrode layer, having a periodic structure, wherein
said first electrode layer is superior to said second electrode layer in ohmic contact with respect to said semiconductor layer, and
said second electrode layer contains a metal exhibiting a higher plasma frequency than said first electrode layer.

2. The semiconductor light-emitting device according to claim 1, wherein
said semiconductor layer is a p-type nitride-based semiconductor layer, and
said first electrode layer is formed to be in contact with said p-type nitride-based semiconductor layer.

3. The semiconductor light-emitting device according to claim 1, wherein
said periodic structure of said second electrode layer is a periodic corrugated shape.

4. The semiconductor light-emitting device according to claim 3, wherein
said periodic structure of said second electrode layer includes a structure obtained by periodically arranging recess portions or projection portions of said corrugated shape in the form of a triangular lattice.

5. The semiconductor light-emitting device according to claim 3, wherein
said periodic structure of said second electrode layer includes a striped periodic structure.

6. The semiconductor light-emitting device according to claim 5, wherein
said semiconductor layer has a projecting ridge portion, and
said second electrode layer having said striped periodic structure is formed on said ridge portion of said semiconductor layer along the extensional direction of said ridge portion.

7. The semiconductor light-emitting device according to claim 1, wherein
said semiconductor layer includes a surface formed with a periodic corrugated shape.

8. The semiconductor light-emitting device according to claim 7, wherein
recess portions or projection portions of said surface of said semiconductor layer formed with said periodic corrugated shape are periodically arranged in the form of a triangular lattice.

9. The semiconductor light-emitting device according to claim 1, wherein
said first electrode layer has a smaller thickness than said second electrode layer.

10. The semiconductor light-emitting device according to claim 1, wherein
said first electrode layer is made of at least one of Ni, Pd and Pt, and
said second electrode layer is made of at least either Al or Ag.

11. The semiconductor light-emitting device according to claim 10, wherein
said first electrode layer contains Pd, and
said second electrode layer contains Ag.

12. The semiconductor light-emitting device according to claim 10, wherein
said first electrode layer contains Pt, and
said second electrode layer contains Al.

13. The semiconductor light-emitting device according to claim 10, wherein
said first electrode layer contains Ni, and
said second electrode layer contains Ag.

14. The semiconductor light-emitting device according to claim 1, wherein
said first electrode layer has said periodic structure, and
said second electrode layer having said periodic structure is formed on said first electrode layer to reflect said periodic structure of said first electrode layer.

15. The semiconductor light-emitting device according to claim 14, wherein
said first electrode layer and said second electrode layer are formed with the same periodic corrugated shapes.

16. The semiconductor light-emitting device according to claim 14, wherein
said second electrode layer is formed with a periodic corrugated shape on the interface between said second electrode layer and said first electrode layer.

17. The semiconductor light-emitting device according to claim 1, further comprising a protective layer formed on said second electrode layer.

18. The semiconductor light-emitting device according to claim 1, extracting light emitted from said emission layer through a region formed with said second electrode layer having said periodic structure.

19. The semiconductor light-emitting device according to claim 1, extracting light emitted from said emission layer through a region opposite to a region formed with said second electrode layer having said periodic structure.

20. The semiconductor light-emitting device according to claim 1, wherein
said semiconductor layer includes a ZnO layer.

* * * * *